(12) United States Patent
Yao et al.

(10) Patent No.: US 9,366,926 B2
(45) Date of Patent: Jun. 14, 2016

(54) PIXEL UNIT, ARRAY SUBSTRATE, METHOD FOR MANUFACTURING ARRAY SUBSTRATE, METHOD FOR REPAIRING ARRAY SUBSTRATE, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Zhixiao Yao, Beijing (CN); Jiarong Liu, Beijing (CN); Hongtao Lin, Beijing (CN); Zhangtao Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/346,036

(22) PCT Filed: Aug. 12, 2013

(86) PCT No.: PCT/CN2013/081301
§ 371 (c)(1),
(2) Date: Mar. 20, 2014

(87) PCT Pub. No.: WO2014/205892
PCT Pub. Date: Dec. 31, 2014

(65) Prior Publication Data
US 2015/0309379 A1 Oct. 29, 2015

(30) Foreign Application Priority Data
Jun. 28, 2013 (CN) .......................... 2013 1 0269567

(51) Int. Cl.
*G02F 1/1362* (2006.01)
*G02F 1/1368* (2006.01)
*H01L 27/12* (2006.01)

(52) U.S. Cl.
CPC ........ *G02F 1/136259* (2013.01); *G02F 1/1368* (2013.01); *G02F 1/13624* (2013.01);
(Continued)

(58) Field of Classification Search
USPC ............................................................ 257/72
See application file for complete search history.

(56) References Cited

U.S. PATENT DOCUMENTS 5,062,690 A * 11/1991 Whetten ............... G02F 1/1309
257/59
6,605,495 B1 8/2003 Kuo
(Continued)

FOREIGN PATENT DOCUMENTS

CN 1740885 A 3/2006
CN 101165904 A 4/2008
(Continued)

OTHER PUBLICATIONS

International Search Report and Written Opinion mailed Mar. 20, 2014 regarding PCT/CN2013/081301.
(Continued)

*Primary Examiner* — Matthew W Such
*Assistant Examiner* — Warren H Kilpatrick
(74) *Attorney, Agent, or Firm* — Harness, Dickey & Pierce, P.L.C.

(57) ABSTRACT

A pixel unit comprises a pixel electrode, a data line and a TFT, and further comprises: a backup TFT, a source electrode of which is isolated from the data line, and a drain electrode of which is isolated from the pixel electrode; a first repair line, one end of the first repair line and the source electrode of the backup TFT being isolated from each other and there being an overlapping region therebetween, and the other end of the first repair line and the data line or a source electrode of the TFT being isolated from each other and there being an overlapping region therebetween; and a second repair line.

18 Claims, 7 Drawing Sheets

(52) U.S. Cl.
CPC ........ *G02F1/136286* (2013.01); *H01L 27/124* (2013.01); *G02F 2001/136268* (2013.01); *G09G 2330/08* (2013.01); *G09G 2330/10* (2013.01)

(56) References Cited

U.S. PATENT DOCUMENTS

2008/0024691 A1    1/2008   Okabe et al.
2010/0214205 A1*   8/2010   Kawamura .......... G02F 1/13624
                                                                                         345/98

FOREIGN PATENT DOCUMENTS

| CN | 101191964 A | 6/2008 |
| CN | 101315505 A | 12/2008 |
| CN | 101847642 A | 9/2010 |

OTHER PUBLICATIONS

Chinese Office Action dated Apr. 3, 2015 regarding Chinese Application No. 201310269567.4. Translation provided by Dragon Intellectual Property Law Firm.

* cited by examiner

PIXEL UNIT, ARRAY SUBSTRATE, METHOD FOR MANUFACTURING ARRAY SUBSTRATE, METHOD FOR REPAIRING ARRAY SUBSTRATE, AND DISPLAY DEVICE

CROSS-REFERENCE TO RELATED APPLICATIONS

This application is a 371 U.S. National Stage of International Application No. PCT/CN2013/081301, filed on Aug. 12, 2013. This application claims priority to Chinese Application No. 201310269567.4, filed on Jun. 28, 2013. The disclosures of the above applications are incorporated herein by reference.

TECHNICAL FIELD

The present invention relates to the field of display technology, in particular to a pixel unit, an array substrate, method for manufacturing the array substrate, method for repairing the array substrate, and a display device.

BACKGROUND

Thin film transistor liquid crystal display (TFT-LCD) is mainly formed by aligning and fitting an array substrate and a color film substrate, and then injecting liquid crystals therebetween. A thin film transistor (TFT) is provided on the array substrate, and a color filter is provided on the color film substrate. The TFT controls the change of a signal and voltage applied to each pixel so as to control a rotation direction of a liquid crystal molecule, thereby to achieve the purpose of display by controlling whether or not polarized light emits from each pixel.

During the manufacturing of the array substrates, defects, such as TFTs are damaged and cannot work normally, are usually occurred due to the limit of process conditions. In order to improve the yield thereof, generally a backup TFT needs to be formed on the array substrate, and when the TFT cannot work normally, this backup TFT will serve as a working TFT after post-repair, so as to control the changes of the signal and voltage applied to the pixel.

FIG. 1 shows an existing repairable array substrate, where the working TFT and the backup TFT are formed on an identical gate metal layer 21. During the post-repair, a metal layer needs to be deposited by means of chemical vapor deposition (CVD) to form a first bridge 12 and a second bridge 13. A source electrode 33 of the backup TFT is coupled to a data line 31 and a drain electrode 32 of the backup TFT is coupled to a pixel electrode 11 by laser-beam drilling. Obviously, such design limits the repair to be performed at an array procedure (an array stage), and a TFT damage after the array procedure cannot be repaired, and the repair process is complex and the time period for the repair is long.

SUMMARY

An object of the present invention is to provide a pixel unit, an array substrate, method for manufacturing the array substrate and method for repairing the array substrate, and a display device, so as to solve the problem that the repair of a damage of an existing TFT is limited to be performed at an array procedure, and the TFT damage after the array procedure cannot be repaired. In addition, it is able to reduce capacitance due to existence of a backup TFT, ensure the product performance, and improve repair rate and yield of the product.

In one aspect, the present invention provides a pixel unit comprising a pixel electrode, a data line and a TFT. The pixel unit further comprises:

a backup TFT provided beside the TFT and configured to replace the TFT when the TFT is damaged, a source electrode of the backup TFT being isolated from the data line, and a drain electrode of the backup TFT being isolated from the pixel electrode;

a first repair line, one end of the first repair line and the source electrode of the backup TFT being isolated from each other and there being an overlapping region between one end of the first repair line and the source electrode of the backup TFT, and the other end of the first repair line and the data line or a source electrode of the TFT being isolated from each other and there being an overlapping region between the other end of the first repair line and the data line or a source electrode of the TFT; and a second repair line, one end of the second repair line and the drain electrode of the backup TFT being isolated from each other and there being an overlapping region between one end of the second repair line and the drain electrode of the backup TFT, and the other end of the second repair line and the pixel electrode or a drain electrode of the TFT being isolated from each other and there being an overlapping region between the other end of the second repair line and the pixel electrode or a drain electrode of the TFT.

Alternatively, the first repair line and/or second repair line are provided on an identical layer to a gate electrode of the TFT.

Alternatively, the first repair line and/or second repair line are provided on an identical layer to the pixel electrode.

Alternatively, the pixel unit further comprises a common electrode, and the first repair line and/or second repair line are provided on an identical layer to the common electrode.

The pixel unit further comprises a gate line. The TFT and the backup TFT are provided at a cross region between the gate line and the data line, and the TFT and the backup TFT are provided on the same gate line.

Alternatively, a gate electrode of the backup TFT is provided on an identical layer to the gate electrode of the TFT, a semiconductor layer of the backup TFT is provided on an identical layer to a semiconductor layer of the TFT, and the source electrode and the drain electrode of the backup TFT are provided on an identical layer to the source electrode and the drain electrode of the TFT.

In another aspect, an embodiment of the present invention provides an array substrate comprising a plurality of pixel units, each of which comprises a pixel electrode, a data line, and a TFT configured to apply a display signal from the data line to the pixel electrode. The pixel unit further comprises:

a backup TFT provided beside the TFT and configured to replace the TFT when the TFT is damaged, a source electrode of the backup TFT being isolated from the data line, and a drain electrode of the backup TFT being isolated from the pixel electrode;

a first repair line, one end of the first repair line and the source electrode of the backup TFT being isolated from each other and there being an overlapping region between one end of the first repair line and the source electrode of the backup TFT, and the other end of the first repair line and the data line or a source electrode of the TFT being isolated from each other and there being an overlapping region between the other end of the first repair line and the data line or a source electrode of the TFT; and a second repair line, one end of the second repair line and the drain electrode of the backup TFT being isolated from each other and there being an overlapping region between one end of the second repair line and the drain electrode of the backup TFT, and the other end of the second repair line and the pixel electrode or a drain electrode of the TFT being isolated from each other and there being an overlapping region between the other end of the second repair line and the pixel electrode or a drain electrode of the TFT.

In yet another aspect, an embodiment the present invention provides a display device comprising the above-mentioned array substrate.

In yet another aspect, an embodiment of the present invention provides a method for manufacturing an array substrate, comprising:

forming a gate metal layer on a substrate, and forming a gate line, a gate electrode of a TFT, a gate electrode of a backup TFT, a first repair line and a second repair line by means of a patterning process;

forming a gate insulation layer, a semiconductor layer and a source-drain metal layer on the substrate on which the gate line, the gate electrodes, the first repair line and the second repair line have been formed, and forming the TFT, the backup TFT and a data line by means of a patterning process, the data line or a source electrode of the TFT and one end of the first repair line being isolated from each other and there being an overlapping region between the data line or the source electrode of the TFT and one end of the first repair line, and the pixel electrode or a drain electrode of the TFT and one end of the second repair line being isolated from each other and there being an overlapping region between the pixel electrode or the drain electrode of the TFT and one end of the second repair line, a source electrode of the backup TFT and the other end of the first repair line being isolated from each other and there being an overlapping region between the source electrode of the backup TFT and the other end of the first repair line, and a drain electrode of the backup TFT and the other end of the second repair line being isolated from each other and there being an overlapping region between the drain electrode of the backup TFT and the other end of the second repair line;

forming a passivation layer and a via-hole of the passivation layer on the substrate on which the TFT, the backup TFT and the data line have been formed; and forming a transparent conductive layer on the substrate on which the passivation layer has been formed, and forming a pixel electrode by means of a patterning process.

In yet another aspect, an embodiment of the present invention provides a method for repairing an array substrate when a TFT is damaged, comprising:

performing laser-beam cutting to disconnect a source electrode of the damaged TFT from a data line and disconnect a drain electrode of the damaged TFT from a pixel electrode; and performing laser-beam welding at an overlapping region between a first repair line and a source electrode of a backup TFT, an overlapping region between the first repair line and a data line or the source electrode of the TFT, an overlapping region between a second repair line and a drain electrode of the backup TFT, and an overlapping region between the second repair line and the pixel electrode or the drain electrode of the TFT, so as to connect the source electrode of the backup TFT to the data line and connect the drain electrode of the backup TFT to the pixel electrode.

Further, with respect to the TFT damage detected after the array substrate and a cell substrate are oppositely arranged to form a cell, the laser-beam cutting and the laser-beam welding are performed at a side of the array substrate which is not opposite to the cell substrate.

According to the pixel unit, the array substrate, the method for manufacturing the array substrate, the method for repairing the array substrate and the display device of embodiments of the present invention, an isolated backup TFT is provided, and when the TFT is damaged and cannot work normally, the damaged TFT is stopped working by means of the laser-beam cutting, and the source electrode of the backup TFT is coupled to the data line and the drain electrode thereof is coupled to the pixel electrode by means of the laser-beam welding. As a result, the backup TFT replaces the damaged TFT to continue the work. The repairing method according to an embodiment of the present invention is not limited to be performed at the array procedure, and with respect to the TFT damage detected after the array substrate and the cell substrate are oppositely arranged to form a cell, the laser-beam cutting and the laser-beam welding can be performed at the side of the array substrate which is not opposite to the cell substrate, so it is able to improve the repair rate and the yield of the product. Moreover, the backup TFT is kept in isolation before the repair and does not work. After the repair, the damaged TFT is also disconnected with the data line and the pixel electrode, so it is able to avoid deterioration in the display performance of the product due to the additional capacitance caused by the backup TFT.

REFERENCE NUMERALS

11—pixel electrode
12—first bridge
13—second bridge
21—gate metal layer
31—data line
32—drain electrode of backup TFT
33—source electrode of backup TFT
22—drain electrode of TFT
23—source electrode of TFT
20—TFT
30—backup TFT
41—gate line 42—second repair line
43—first repair line
40—substrate
44—gate insulation layer
45—semiconductor layer
46—source-drain metal layer
47—passivation layer
50—via-hole of passivation layer

DETAILED DESCRIPTION

A pixel unit, an array substrate, a display device, a method for manufacturing the array substrate and a method for repairing the array substrate according to embodiments of the present invention will be described hereinafter in conjunction with the drawings.

First Embodiment

Figure 1:
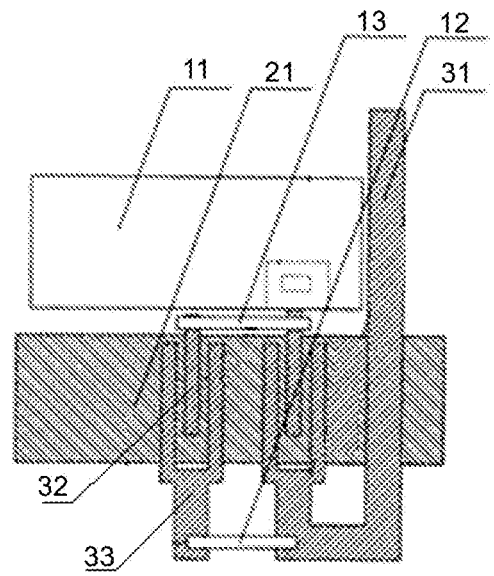
FIG. 1 is a schematic view showing a structure of an existing array substrate.
Figure 2:
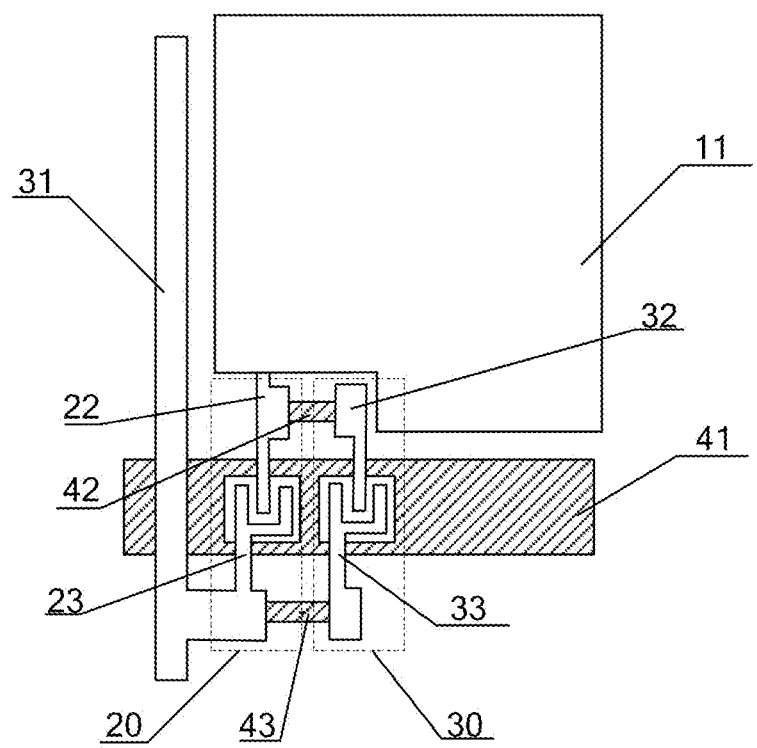
FIG. 2 is a schematic view showing a structure of a pixel unit according to the first embodiment of the present invention.

As shown in FIG. 2, an embodiment of the present invention provides a pixel unit comprising a pixel electrode 11, a data line 31 and a TFT 20 configured to apply a display signal from the data line 31 to the pixel electrode 11. The pixel unit further comprises:

a backup TFT 30 provided beside the TFT 20 and configured to replace the TFT 20 when the TFT 20 is damaged, a source electrode 33 of the backup TFT 30 being isolated from the data line 31, and a drain electrode 32 of the backup TFT 30 being isolated from the pixel electrode 11;

a first repair line 43, one end of the first repair line 43 and the source electrode 33 of the backup TFT 30 being isolated from each other and there being an overlapping region between one end of the first repair line 43 and the source electrode 33 of the backup TFT 30, and the other end of the first repair line 43 and a source electrode 23 of the TFT 20 (or the data line 31) being isolated from each other and there being an overlapping region between the other end of the first repair line 43 and a source electrode 23 of the TFT 20; and a second repair line 42, one end of the second repair line 42 and the drain electrode 32 of the backup TFT 30 being isolated from each other and there being an overlapping region between one end of the second repair line 42 and the drain electrode 32 of the backup TFT 30, and the other end of the second repair line 42 and a drain electrode 22 of the TFT 20 (or the pixel electrode 11) being isolated from each other and there being an overlapping region between the other end of the second repair line 42 and a drain electrode 22 of the TFT 20.

Before repair, the backup TFT 30 in this embodiment is kept in isolation, i.e., the source electrode 33 of the backup TFT 30 is isolated from the data line 31, the drain electrode 32 thereof is isolated from the pixel electrode 11, and the backup TFT 30 does not work. After the repair, the damaged TFT is also kept in isolation, and does not work. Hence, the existence of the backup TFT 30 will not affect the display performance of the product.

As shown in FIG. 2, the pixel unit further comprises a gate line 41. The TFT 20 and the backup TFT 30 are provided at a cross region between the gate line 41 and the data line 31, and the TFT 20 and the backup TFT 30 are provided on the same gate line 41. Gate electrodes of the TFT 20 and the backup TFT 30 are just the gate line 41.

The first repair line 43 and the second repair line 42 are parallel to the gate line 41. Two ends of the first repair line 43 are isolated from the source electrode 23 of the TFT 20 and the source electrode 33 of the backup TFT 30, respectively, and the overlapping regions exist therebetween, Two ends of the second repair line 42 are isolated from the drain electrode 22 of the TFT 20 and the drain electrode 32 of the backup TFT 30, respectively, and the overlapping regions exist therebetween. "The two parts are isolated from each other and there being the overlapping region between the two parts" means that the two parts are provided on different layers and there exists a cross, overlapping region therebetween. The term "isolate" means that the two parts are not in contact with each other, and there certainly exists no electrical connection therebetween. If laser-beam welding is adopted at the cross, overlapping region, an electrical connection will be established between them.

Preferably, the first repair line 43 and the second repair line 42 are provided on an identical layer to the gate electrode of the TFT 20. Apart from the gate line, the gate electrode of the TFT 20 and the gate electrode of the backup TFT 30, the first repair line 43 and the second repair line 42 are also formed on the gate metal layer. The first repair line 43 and the second repair line 42 may be provided in parallel to the gate line 41. One end of the first repair line 43 is provided below (or above) the source electrode 23 of the TFT with a gate insulation layer provided therebetween, and the other end thereof is provided below (or above) the source electrode 33 of the backup TFT with the gate insulation layer provided therebetween. One end of the second repair line 42 is provided below (or above) the drain electrode 22 of the TFT with the gate insulation layer provided therebetween, and the other end thereof is provided below (or above) the drain electrode 32 of the backup TFT with the gate insulation layer provided therebetween.

Figure 3:
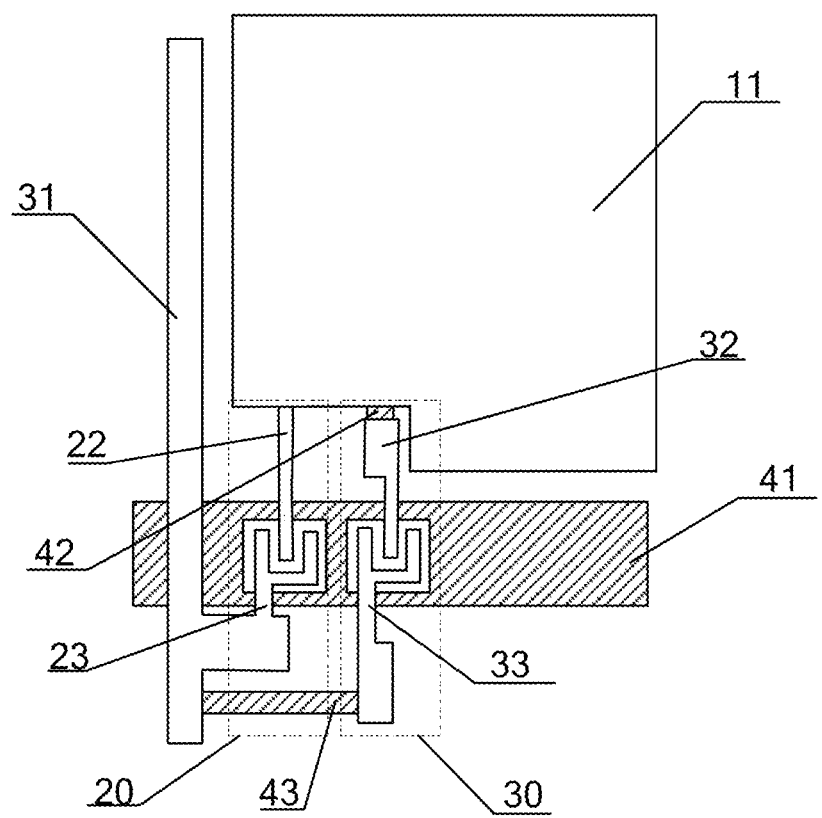
FIG. 3 is a schematic view showing a structure of another pixel unit according to the first embodiment of the present invention.

Of course, as shown in FIG. 3, one end of the first repair line 43 may be provided below (or above) the data line 31 with the gate insulation layer provided between, and the other end thereof may be provided below (or above) the source electrode 33 of the backup TFT with the gate insulation layer provided therebetween. One end of the second repair line 43 may be provided below (or above) the pixel electrode 11 with the gate insulation layer provided therebetween, and the other end thereof may be provided below (or above) the drain electrode 32 of the backup TFT with the gate insulation layer provided therebetween.

In addition, during the implementation, the first repair line 43 and/or the second repair line 42 may also be provided as a transparent conductive layer, i.e., the first repair line 43 and/or the second repair line 42 may also be provided on an identical layer to the pixel electrode 11 or a common electrode. However, during the design, for the widths of the first repair line 43 and the second repair line 42, the difference in the resistivity between the transparent conductive layer and the metal layer (when the first repair line 43 and the second repair line 42 are provided on the gate metal layer) needs to be taken into consideration, so as to avoid the deterioration in the display effect due to the difference in the resistance after the repair.

In one example, the gate electrode of the backup TFT 30 is provided on an identical layer to the gate electrode of the TFT 20, the semiconductor layer of the backup TFT 30 is provided on an identical layer to the semiconductor layer of the TFT 20, and the source electrode and the drain electrode of the backup TFT 30 are provided on an identical layer to the source electrode and the drain electrode of the TFT 20. As a result, during the manufacturing, the backup TFT 30 and the TFT 20 may be formed at the same time.

The TFT 20 and the backup TFT 30 may be both of a bottom-gate structure, or a top-gate structure. The bottom-gate structure as shown in FIG. 2 may be used, so as to facilitate the repair at the backside (the side which is not opposite to the cell substrate) of the array substrate.

According to an embodiment of the present invention, an isolated backup TFT is provided on the pixel unit, and when the TFT is damaged and cannot work normally, the damaged TFT is stopped working by means of the laser-beam cutting, and the source electrode of the backup TFT is coupled to the data line and the drain electrode thereof is coupled to the pixel electrode by means of the laser-beam welding. As a result, the backup TFT replaces the damaged TFT to continue the work. With respect to the TFT damage detected after the array substrate and the cell substrate are oppositely arranged to form a cell, the laser-beam cutting and the laser-beam welding are performed at the side of the array substrate which is not opposite to the cell substrate, so the repairing method of an embodiment of the present invention is not limited to be performed at the array procedure and it is able to improve the repair rate and the yield of the product. Moreover, the backup TFT is kept in isolation before the repair and does not work. After the repair, the damaged TFT is also kept in isolation and does not work, so it is able to avoid the additional capacitance caused by the backup TFT, thereby to ensure the display performance of the product.

Second Embodiment

Figure 4:
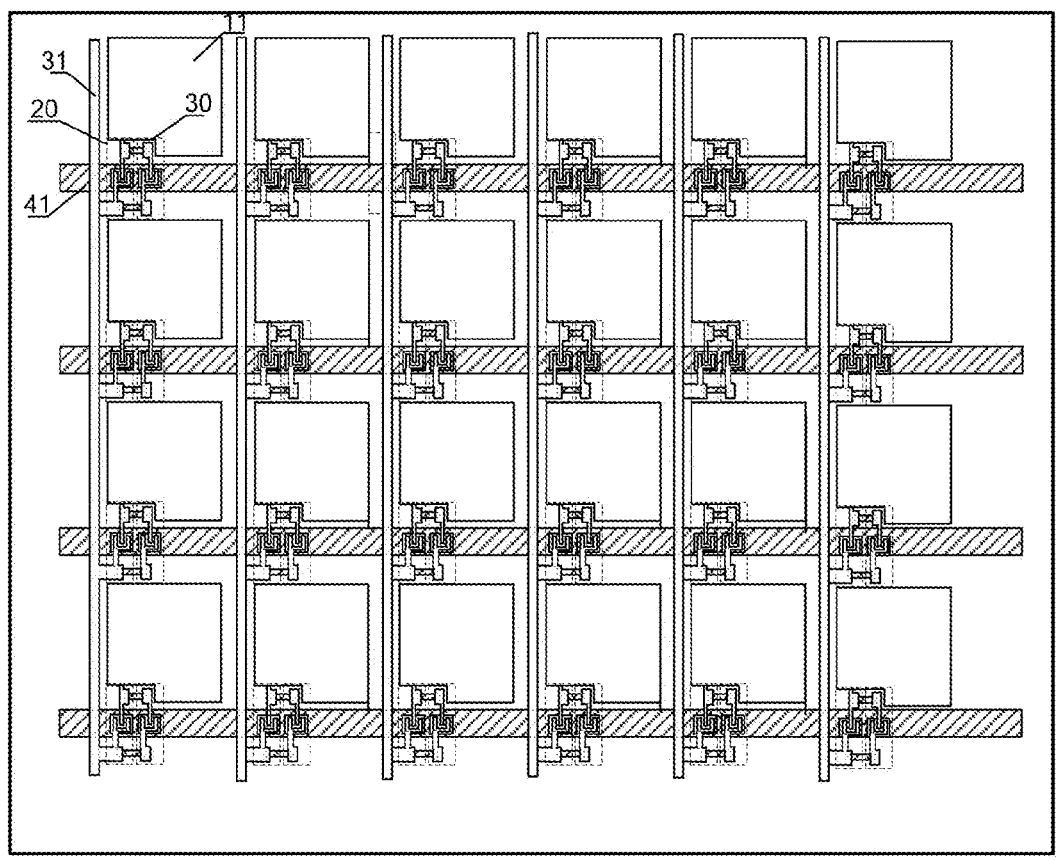
FIG. 4 is a schematic view showing a structure of an array substrate according to the second embodiment of the present invention.

As shown in FIG. 4 in conjunction with FIG. 2, an embodiment of the present invention further provides an array substrate comprising a plurality of pixel units. Taking the first pixel unit at the upper left position as an example, it comprises a pixel electrode 11, a data line 31, and a TFT 20 configured to apply a display signal from the data line 31 to the pixel electrode 11. The pixel unit further comprises: a backup TFT 30 provided beside the TFT 20 and configured to replace the TFT 20 when it is damaged, a source electrode 33 of the backup TFT 30 being isolated from the data line 31, and a drain electrode 32 thereof being isolated from the pixel electrode 11; a first repair line 43, one end of the first repair line 43 and the source electrode 33 of the backup TFT 30 being isolated from each other and there being an overlapping region therebetween, and the other end of the first repair line 43 and a source electrode 23 of the TFT 20 (or the data line 31) being isolated from each other and there being an overlapping region therebetween; and a second repair line 42, one end of the second repair line 42 and the drain electrode 32 of the backup TFT 30 being isolated from each other and there being an overlapping region therebetween, and the other end of the second repair line 42 and a drain electrode 22 of the TFT 20 (the pixel electrode 11) being isolated from each other and there being an overlapping region therebetween.

In one example, the first repair line 43 and/or the second repair line 42 are provided on an identical layer to a gate electrode of the TFT 20. Alternatively, the first repair line 43 and/or the second repair line 42 may be provided on an identical layer to the pixel electrode 11 or a common electrode.

The pixel unit on the array substrate further comprises a gate line 41. The TFT 20 and the backup TFT 30 are provided at a cross region between the gate line 41 and the data line 31, and the TFT 20 and the backup TFT 30 are provided on the same gate line 41. Gate electrodes of the TFT 20 and the backup TFT 30 are just the gate line 41.

In one example, the gate electrode of the backup TFT 30 is provided on an identical layer to the gate electrode of the TFT 20, the semiconductor layer of the backup TFT 30 is provided on an identical layer to the semiconductor layer of the TFT 20, and the source electrode and the drain electrode of the backup TFT 30 are provided on an identical layer to the source electrode and the drain electrode of the TFT 20. As a result, during the manufacturing, the backup TFT 30 and the TFT 20 may be formed at the same time.

The TFT 20 and the backup TFT 30 may be both of a bottom-gate structure, or a top-gate structure. However, the bottom-gate structure as shown in FIG. 2 may be used, so as to facilitate the repair at a backside (the side which is not opposite to the cell substrate) of the array substrate.

On the array substrate according to an embodiment of the present invention, an isolated backup TFT is provided for each pixel unit, and when the TFT is damaged and cannot work normally, the source electrode of the backup TFT is coupled to the data line and the drain electrode thereof is coupled to the pixel electrode by means of repair. As a result, the backup TFT will replace the damaged TFT to continue the work. With respect to the TFT damage detected after the array substrate and the cell substrate are arranged oppositely to form a cell, the laser-beam cutting and the laser-beam welding are performed at the side of the array substrate which is not opposite to the cell substrate, so the repairing method of the disclosure is not limited to be performed at the array procedure and it is able to improve the repair rate and the yield of the product. Moreover, the backup TFT is kept in isolation before the repair. After the TFT is damaged and the repair is performed, the backup TFT is in a working state, and the damaged TFT is disconnected to stop working. As a result, it is able to avoid the additional capacitance caused by the backup TFT, thereby to ensure the display performance of the product.

The present invention further provides a display device comprising the above-mentioned array substrate. The display device may be any products or parts having a display function, such as a liquid crystal panel, an electronic paper, an OLED panel, a mobile phone, a tablet PC, a TV, a display, a laptop computer, a digital photo frame and a navigator.

An embodiment of the present invention further provides a method for repairing the array substrate when a TFT is damaged, comprising the following steps.

Figure 5:
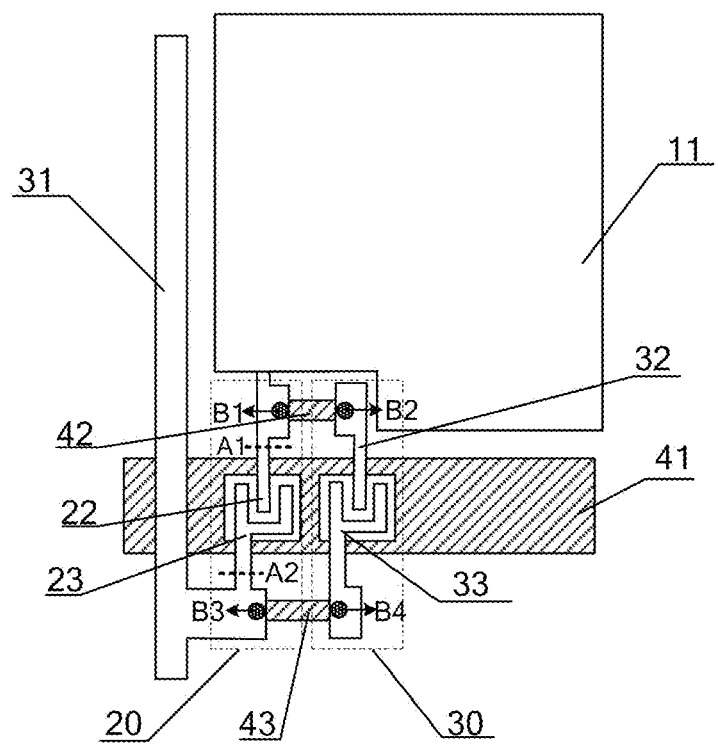
FIG. 5 is a schematic view showing a method for repairing a damage of a TFT on the array substrate before forming a cell according to the third embodiment of the present invention.
Figure 6:
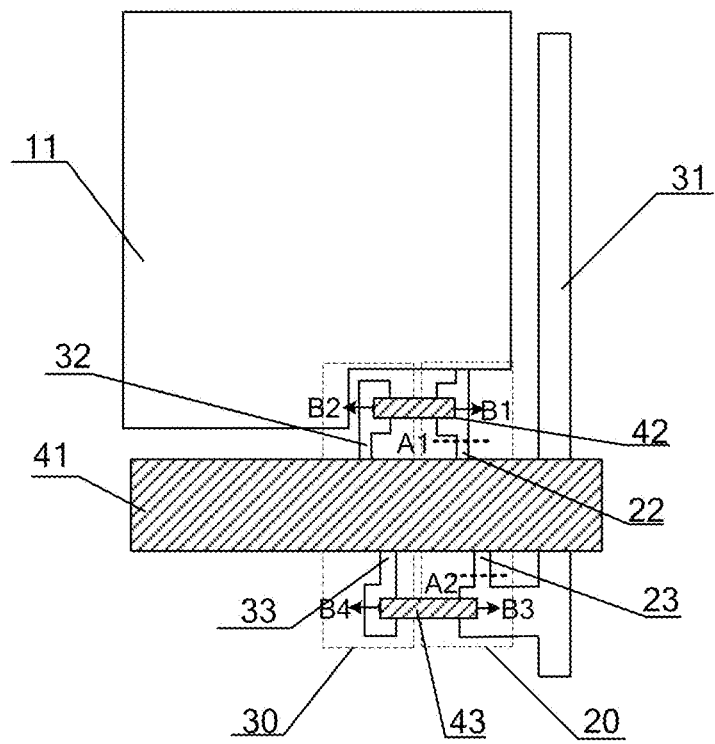
FIG. 6 is another schematic view showing the method for repairing the damage of the TFT on the array substrate after forming a cell according to the third embodiment of the present invention.

Step 1: performing laser-beam cutting to disconnect the source electrode 23 of the damaged TFT 20 from the data line 31 and disconnect the drain electrode 22 of the damaged TFT from the pixel electrode 11 along cutting marks A1 and A2 as shown by the dotted lines in FIGS. 5-6, so as to stop the damaged TFT 20 from working.

Step 2: performing laser-beam welding at an overlapping region between the first repair line 43 and the source electrode 33 of the backup TFT, an overlapping region between the first repair line 43 and the source electrode 23 of the TFT (or the data line 31), an overlapping region between the second repair line 42 and the drain electrode 32 of the backup TFT, and an overlapping region between the second repair line 42 and the drain electrode 32 of the TFT (or the pixel electrode 11), i.e., at the positions as shown by welding marks B4, B3, B2 and B1, so as to connect the source electrode 33 of the backup TFT to the data line 31 and connect the drain electrode 32 of the backup TFT to the pixel electrode 11. The backup TFT 30 replaces the damaged TFT 20 to continue the work, and the display signal is applied from the data line to the pixel electrode through the backup TFT 30.

It is to be noted that, with respect to the TFT damage detected after the array substrate and the cell substrate are oppositely arranged to form a cell, the laser-beam cutting and the laser-beam welding need to be performed at the side of the array substrate which is opposite to the cell substrate. To be specific, as shown in FIG. 6, the cutting is performed along the cutting marks A1 and A2 by passing the laser beam through a substrate (usually a transparent glass substrate), and the welding is performed at the positions as shown by the welding marks B4, B3, B2 and B1 by passing the laser beam through the substrate, so that the backup TFT can replace the damaged TFT to continue the work.

With respect to the TFT damage detected before the array substrate and the cell substrate are oppositely arranged to form a cell, the laser-beam cutting and the laser-beam welding may be performed, as shown in FIG. 5, at the side of the array substrate which is opposite to the cell substrate or, as shown in FIG. 6, at side of the array substrate which is not opposite to the cell substrate.

According to the array substrate and its repairing method of embodiments of the present invention, the repair is not limited to be performed at the array procedure, so it is able to improve the repair rate and the yield of the product. Moreover, the backup TFT is kept in isolation before the repair. After the TFT is damaged and the repair is performed, the backup TFT is in a working state, and the damaged TFT is disconnected to stop working. As a result, it is able to avoid the additional capacitance caused by the backup TFT, thereby to ensure the display performance of the product.

Third Embodiment

Figure 7:
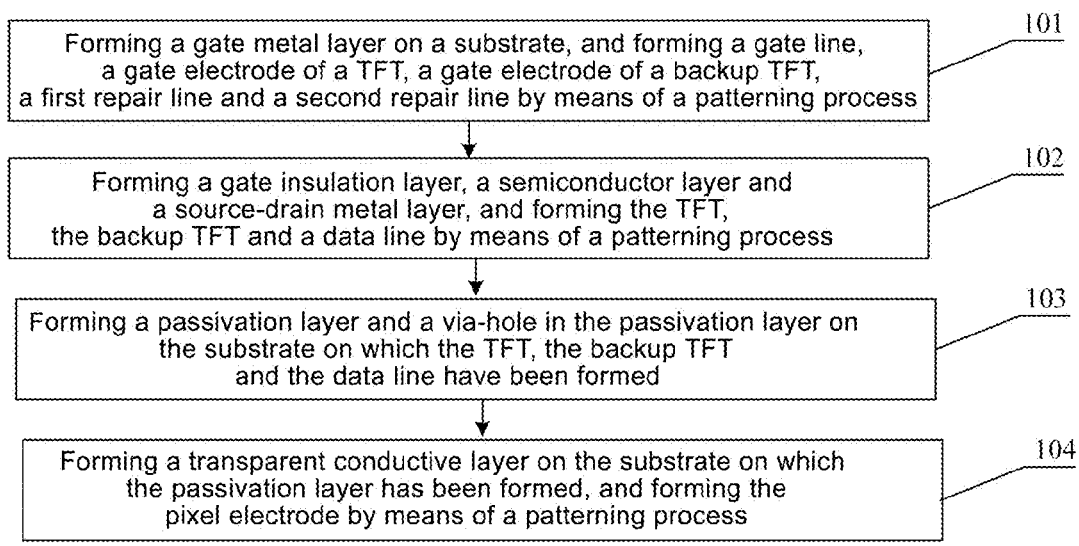
FIG. 7 is a flow chart of a method for manufacturing an array substrate according to the fourth embodiment of the present invention.

As shown in FIG. 7, an embodiment of the present invention provides a method for manufacturing an array substrate, comprising the following steps.

Step 101: forming a gate metal layer on a substrate, and forming a gate line, a gate electrode of a TFT, a gate electrode of a backup TFT, a first repair line and a second repair line by means of a patterning process.

In one example, when the TFT and the backup TFT are provided on the same gate line, the gate electrodes of the TFT and the backup TFT are just the gate line. At this time, the gate line 41, the first repair line 43 and the second repair line 42 are formed on the gate metal layer formed in Step 101, as shown in FIG. 8 (*a*).

Figure 8:
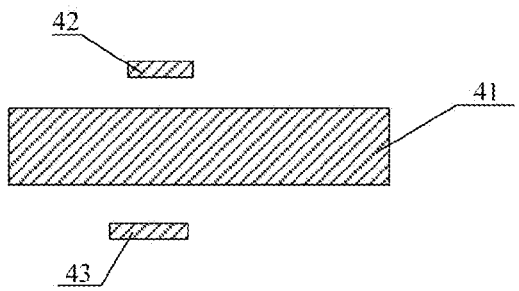
FIGS. 8(a)-8(d) are schematic views showing the manufacturing procedure of the array substrate according to the fourth embodiment of the present invention.
Figure 8:
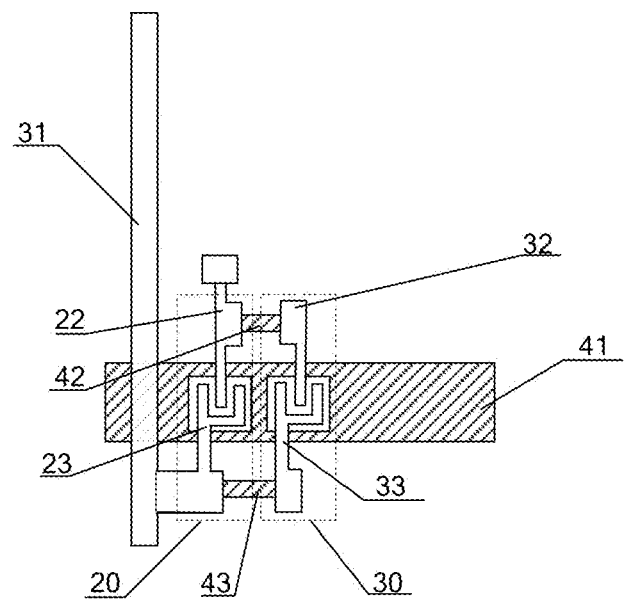
Figure 8:
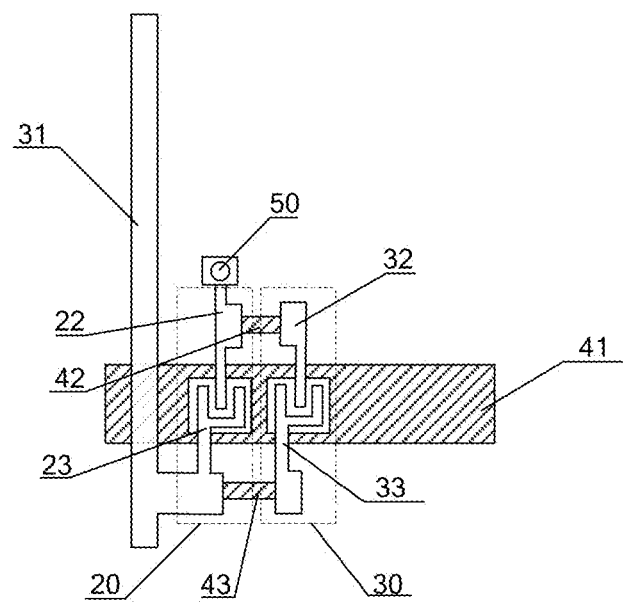
Figure 8:
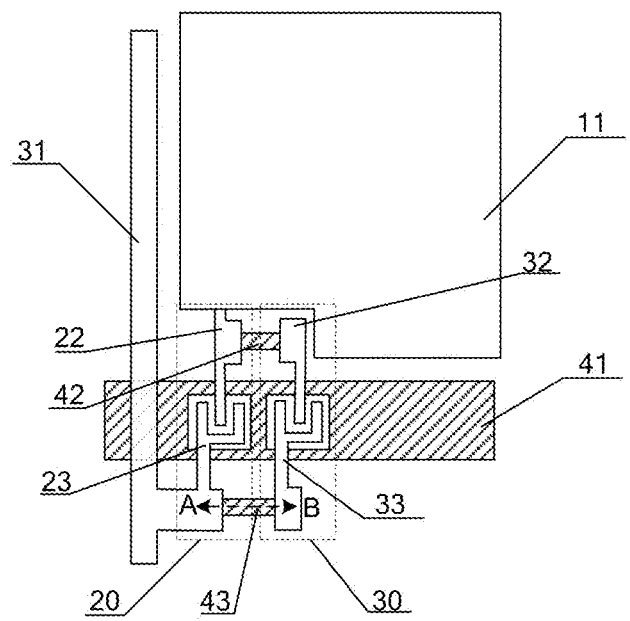

Step 102: as shown FIG. 8(*b*), forming a gate insulation layer, a semiconductor layer and a source-drain metal layer on the substrate on which the gate line 41, the gate electrodes, the first repair line 43 and the second repair line 42 have been formed, and forming the TFT 20, the backup TFT 30 and a data line 31 by means of a patterning process, a source electrode 23 of the TFT (or the data line 31) and one end of the first repair line 43 being isolated from each other and there being an overlapping region therebetween, and a drain electrode 22 of the TFT (or the pixel electrode) and one end of the second repair line being isolated from each other and there being an overlapping region therebetween, a source electrode 33 of the backup TFT and the other end of the first repair line 43 being isolated from each other and there being an overlapping region therebetween, and a drain electrode 32 of the backup TFT and the other end of the second repair line 42 being isolated from each other and there being an overlapping region therebetween.

This step mainly includes the deposition of the gate insulation layer, the semiconductor layer and the source-drain metal layer, and the channel etching of the data line, the source and drain electrodes of the TFTs (the TFT 20 and the backup TFT 30) and the TFTs.

Step 103: as shown in FIG. 8(*c*), forming a passivation layer (not shown) on the substrate on which the TFT 20, the backup TFT 30 and the data line 31 have been formed, and a via-hole 50 in the passivation layer for connecting the drain electrode 22 of the TFT 20 and a pixel electrode formed subsequently.

Step 104: forming a transparent conductive layer on the substrate on which the passivation layer has been formed, and forming the pixel electrode 11 by means of a patterning process, thereby to form the array substrate as shown in FIG. 8 (*d*).

Figure 9:
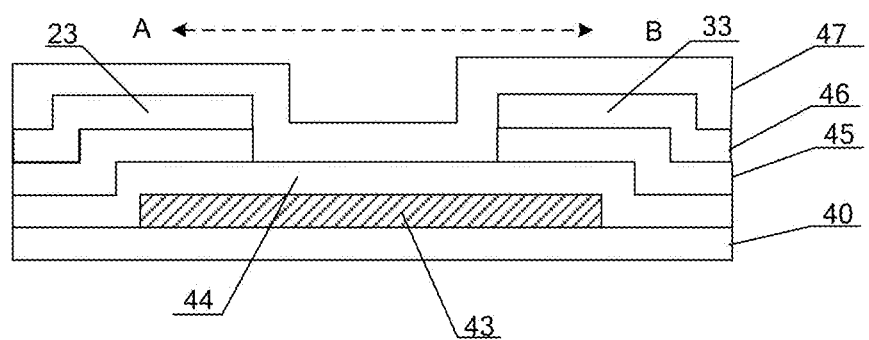
FIG. 9 is a sectional view along line A-B in FIG. 8(d).

In this embodiment, FIG. 9 shows a section view of the first repair line 43 (along the dotted line A-B). As shown in FIG. 9, from bottom to top, the substrate 40, the gate metal layer (forming the first repair line 43, the gate electrode of the TFT and the gate electrode of the backup TFT) formed on the substrate 40, the gate insulating layer 44, the semiconductor 45, the source-drain metal layer 46 (forming the source electrode 23 of the TFT and the source electrode 33 of the backup TFT) and the passivation layer 47 are provided sequentially. Two ends of the first repair line 43 overlap the source electrode 23 of the TFT and the source electrode 33 of the backup TFT respectively, with the gate insulation layer 44 and the semiconductor layer 45 being provided therebetween. The laser-beam welding is performed at the overlapping region (corresponding to the welding marks B4 and B3 in FIG. 6). Here, the laser-beam welding may be performed at the backside of the substrate 40 (i.e., the side of the array substrate which is not opposite to the cell substrate, corresponding to the lower surface of the substrate 40 as shown in FIG. 9), or performed from the top (i.e., the side of the array substrate which is opposite to the cell substrate, corresponding to the upper surface as shown in FIG. 9), so that the source electrode 23 of the TFT is electrically connected to the left end of the first repair line 43 below the source electrode 23 of the TFT, and the source electrode 33 of the backup TFT is electrically connected to the right end of the first repair line 43 below the source electrode 33 of the backup TFT. The sectional structure of the second repair line 42 and the welding procedure at the ends of the second repair line 42 are similar to those mentioned above and will not be repeated herein.

In Step 102, when the channel etching of the TFTs is performed, the semiconductor layer between the gate metal layer and the source-drain metal layer as shown in FIG. 9 may be removed by etching at the same time. In addition, in this embodiment, it is merely required to ensure that the two ends of the first repair line 43 are isolated from the source electrode 23 of the TFT (or the data line 31) and the source electrode 33 of the backup TFT respectively and there are overlapping regions therebetween, and that the two ends of the second repair line 42 are isolated from the drain electrode 22 of the TFT (or the pixel electrode 11) and the drain electrode 32 of the backup TFT respectively and there are overlapping regions therebetween. It is not limited in this embodiment whether any other layers are formed between the gate metal layer and the source-drain metal layer in FIG. 9.

According to the method for manufacturing the array substrate of an embodiment of the present invention, an isolated backup TFT is provided, and when the TFT is damaged and cannot work normally, the damaged TFT will stop working by means of the laser-beam cutting, and the source electrode of the backup TFT is coupled to the data line and the drain electrode thereof is coupled to the pixel electrode by means of the laser-beam welding. As a result, the backup TFT replaces the damaged TFT to continue the work. With respect to the TFT damage detected after the array substrate and the cell substrate are oppositely arranged to form a cell, the laser-beam cutting and the laser-beam welding are performed at a side of the array substrate which is not opposite to the cell substrate, so the method is not limited to be performed at the array procedure and it is able to improve the repair rate and the yield of the product. Moreover, the backup TFT is kept in isolation before the repair and does not work. As a result, it is able to avoid the additional capacitance caused by the backup TFT, thereby to ensure the display performance of the product.

It is to be noted that, the technical features in the above embodiments can be combined with each other if without any conflict.

The above are merely the preferred embodiments of the present invention, but the scope of the present invention is not limited thereto. A person skilled in the art can readily make alterations or substitutions within the disclosure of the present invention, and these alterations or substitutions shall also fall within the scope of the present invention. Hence, the scope of the present invention shall be determined by the appended claims.

What is claimed is:

1. A pixel unit comprising a pixel electrode, a data line and a TFT, the pixel unit further comprising:
   a backup TFT provided beside the TFT and configured to replace the TFT when the TFT is damaged, a source electrode of the backup TFT being isolated from the data line, and a drain electrode of the backup TFT being isolated from the pixel electrode;
   a first repair line, one end of the first repair line and the source electrode of the backup TFT being isolated from each other and there being an overlapping region between one end of the first repair line and the source electrode of the backup TFT, and the other end of the first repair line and a source electrode of the TFT being isolated from each other and there being an overlapping region between the other end of the first repair line and a source electrode of the TFT; and
   a second repair line, one end of the second repair line and the drain electrode of the backup TFT being isolated from each other and there being an overlapping region between one end of the second repair line and the drain electrode of the backup TFT, and the other end of the second repair line and a drain electrode of the TFT being isolated from each other and there being an overlapping region between the other end of the second repair line and the drain electrode of the TFT.

2. The pixel unit according to claim 1, wherein the first repair line and/or the second repair line are provided on an identical layer to a gate electrode of the TFT.

3. The pixel unit according to claim 2, wherein the pixel unit further comprises a gate line, and the TFT and the backup TFT are provided at a cross region between the gate line and the data line, and the TFT and the backup TFT are provided on the gate line.

4. The pixel unit according to claim 1, wherein the first repair line and/or the second repair line are provided on an identical layer to the pixel electrode.

5. The pixel unit according to claim 4, wherein the pixel unit further comprises a gate line, and the TFT and the backup TFT are provided at a cross region between the gate line and the data line, and the TFT and the backup TFT are provided on the gate line.

6. The pixel unit according to claim 1, wherein the pixel unit further comprises a common electrode, and the first repair line and/or the second repair line are provided on an identical layer to the common electrode.

7. The pixel unit according to claim 6, wherein the pixel unit further comprises a gate line, and the TFT and the backup TFT are provided at a cross region between the gate line and the data line, and the TFT and the backup TFT are provided on the gate line.

8. The pixel unit according to claim 1, wherein the pixel unit further comprises a gate line, and the TFT and the backup TFT are provided at a cross region between the gate line and the data line, and the TFT and the backup TFT are provided on the gate line.

9. The pixel unit according to claim 1, wherein a gate electrode of the backup TFT is provided on an identical layer to the gate electrode of the TFT, a semiconductor layer of the backup TFT is provided on an identical layer to a semiconductor layer of the TFT, and the source electrode and the drain electrode of the backup TFT are provided on an identical layer to the source electrode and the drain electrode of the TFT.

10. An array substrate comprising a plurality of pixel units, each of which comprises a pixel electrode, a data line, and a TFT configured to apply a display signal from the data line to the pixel electrode, the pixel unit further comprising:
    a backup TFT provided beside the TFT and configured to replace the TFT when the TFT is damaged, a source electrode of the backup TFT being isolated from the data line, and a drain electrode of the backup TFT being isolated from the pixel electrode;
    a first repair line, one end of the first repair line and the source electrode of the backup TFT being isolated from each other and there being an overlapping region between one end of the first repair line and the source electrode of the backup TFT, and the other end of the first repair line and a source electrode of the TFT being isolated from each other and there being an overlapping region between the other end of the first repair line and a source electrode of the TFT; and
    a second repair line, one end of the second repair line and the drain electrode of the backup TFT being isolated from each other and there being an overlapping region between one end of the second repair line and the drain electrode of the backup TFT, and the other end of the second repair line and a drain electrode of the TFT being isolated from each other and there being an overlapping region between the other end of the second repair line and the drain electrode of the TFT.

11. The array substrate according to claim 10, wherein the first repair line and/or the second repair line are provided on an identical layer to a gate electrode of the TFT.

12. The array substrate according to claim 11, wherein the pixel unit further comprises a gate line, and the TFT and the backup TFT are provided at a cross region between the gate line and the data line, and the TFT and the backup TFT are provided on the gate line.

13. The array substrate according to claim 10, wherein the first repair line and/or the second repair line are provided on an identical layer to the pixel electrode.

14. The array substrate according to claim 13, wherein the pixel unit further comprises a gate line, and the TFT and the backup TFT are provided at a cross region between the gate line and the data line, and the TFT and the backup TFT are provided on the gate line.

15. The array substrate according to claim 10, wherein the pixel unit further comprises a common electrode, and the first repair line and/or the second repair line are provided on an identical layer to the common electrode.

16. The array substrate according to claim 15, wherein the pixel unit further comprises a gate line, and the TFT and the backup TFT are provided at a cross region between the gate line and the data line, and the TFT and the backup TFT are provided on the gate line.

17. The array substrate according to claim 10, wherein the pixel unit further comprises a gate line, and the TFT and the backup TFT are provided at a cross region between the gate line and the data line, and the TFT and the backup TFT are provided on the gate line.

18. A display device comprising the array substrate according to claim 10.

* * * * *